United States Patent
Kadowaki et al.

(10) Patent No.: US 9,318,653 B2
(45) Date of Patent: Apr. 19, 2016

(54) LUMINESCENT DEVICE AND MANUFACTURING METHOD FOR LUMINESCENT DEVICE AND SEMICONDUCTOR DEVICE

(71) Applicant: DOWA ELECTRONICS MATERIALS CO., LTD., Tokyo (JP)

(72) Inventors: Yoshitaka Kadowaki, Tokyo (JP); Tatsunori Toyota, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 0 days.

(21) Appl. No.: 14/725,635

(22) Filed: May 29, 2015

(65) Prior Publication Data

US 2015/0295129 A1    Oct. 15, 2015

Related U.S. Application Data

(62) Division of application No. 13/978,677, filed as application No. PCT/JP2012/050363 on Jan. 11, 2012, now Pat. No. 9,082,893.

(30) Foreign Application Priority Data

Jan. 17, 2011   (JP) .................................. 2011-007083

(51) Int. Cl.
| | |
|---|---|
| *H01L 27/15* | (2006.01) |
| *H01L 33/12* | (2010.01) |
| *H01L 33/00* | (2010.01) |
| *H01L 33/02* | (2010.01) |
| *H01L 33/10* | (2010.01) |

(Continued)

(52) U.S. Cl.
CPC .............. *H01L 33/12* (2013.01); *H01L 33/007* (2013.01); *H01L 33/0079* (2013.01);
(Continued)

(58) Field of Classification Search
CPC ... H01L 33/007; H01L 33/0095; H01L 33/10; H01L 33/12; H01L 33/32

USPC .............................................. 257/79; 438/44
See application file for complete search history.

(56) References Cited

U.S. PATENT DOCUMENTS

| 6,331,063 B1 | 12/2001 | Kamada et al. |
| 2003/0057417 A1 | 3/2003 | Lee et al. |

(Continued)

FOREIGN PATENT DOCUMENTS

| JP | 2007-200929 A | 8/2007 |
| JP | 2008-053685 A | 3/2008 |

(Continued)

OTHER PUBLICATIONS

Feb. 14, 2012 International Search Report issued in International Patent Application No. PCT/JP2012/050363.

*Primary Examiner* — Matthew Gordon
(74) *Attorney, Agent, or Firm* — Oliff PLC

(57) ABSTRACT

A luminescent device and a manufacturing method for the luminescent device and a semiconductor device which are free from occurrence of cracks in a compound semiconductor layer due to the internal stress in the compound semiconductor layer at the time of chemical lift-off. The luminescent device manufacturing method includes forming a device region on part of an epitaxial substrate through a lift-off layer; forming a sacrificing portion, being not removed in a chemical lift-off step, around device region on epitaxial substrate; covering epitaxial substrate and semiconductor layer and forming a covering layer such that level of surface thereof in the region away from device region is lower than luminescent layer surface; removing covering layer on semiconductor layer, and that on sacrificing portion surface; forming a reflection layer on covering layer surface and semiconductor layer surface; and forming a supporting substrate by providing plating on reflection layer.

6 Claims, 13 Drawing Sheets

(51) Int. Cl.
*H01L 33/32* (2010.01)
*H01L 33/46* (2010.01)
*H01S 5/042* (2006.01)
*H01S 5/323* (2006.01)

(52) U.S. Cl.
CPC ......... *H01L 33/0095* (2013.01); *H01L 33/025* (2013.01); *H01L 33/10* (2013.01); *H01L 33/32* (2013.01); *H01L 33/46* (2013.01); *H01S 5/0425* (2013.01); *H01S 5/32341* (2013.01); *H01S 2301/176* (2013.01)

(56) References Cited

U.S. PATENT DOCUMENTS

2005/0184297 A1 8/2005 Hsieh
2005/0221520 A1 10/2005 Ou et al.
2007/0295952 A1 12/2007 Jang et al.

FOREIGN PATENT DOCUMENTS

| JP | 2008-078275 A | 4/2008 |
| JP | 2009-541989 A | 11/2009 |
| WO | 2006/126330 A1 | 11/2006 |

LUMINESCENT DEVICE AND MANUFACTURING METHOD FOR LUMINESCENT DEVICE AND SEMICONDUCTOR DEVICE

This is a Division of application Ser. No. 13/978,677 filed Jul. 8, 2013, which is a National Phase of Application No. PCT/JP2012/050363 filed Jan. 11, 2012, which claims priority to Japanese Patent Application No. 2011-007083 filed Jan. 17, 2011. The disclosure of the prior applications are hereby incorporated by reference herein in their entireties.

BACKGROUND

1. Technical Field

The present invention relates to a luminescent device and a manufacturing method for the luminescent device and a semiconductor device, and particularly relates to a luminescent device having a structure in which a p-type semiconductor layer and an n-type semiconductor layer are laminated on a supporting portion and a manufacturing method therefor.

2. Background Art

Group III nitride semiconductors have a wide band gap, and therefore, they are widely used as materials for luminescent devices, such as blue, green, and other color LEDs (light-emitting diodes), LDS (laser diodes), and the like. Such luminescent devices are configured by laminating a p-type semiconductor layer (p-type layer) and an n-type semiconductor layer (n-type layer) by the epitaxial growth process.

In order to manufacture such a structure with a good quality being provided at a low cost, a p-type layer and an n-type layer are epitaxially grown on an epitaxial substrate made of a material other than the group III nitride semiconductor in general. In this case, the type of material which can be used as an epitaxial substrate for obtaining a semiconductor layer with a particularly good quality is limited. For example, gallium nitride (GaN), a typical group III nitride semiconductor, can be grown on a dissimilar epitaxial substrate formed of SiC, sapphire, or the like, by the MOCVD (Metal Organic Chemical Vapor Deposition) process, the HVPE (Hydride Vapor Phase Epitaxy) process, or the like.

However, since sapphire is an insulator, it is required to provide two electrodes on the top face of a semiconductor layer laminated thereon, which has caused problems that the effective luminescent area is narrowed down for a given substrate area, in comparison with the conductive substrate, and both electrodes being provided on the same face locally increases the current density, resulting in the device being deteriorated due to the heat generated.

Then, in Patent Document 1, there is disclosed a method for manufacturing a luminescent device utilizing the laser lift-off technology, and in Patent Document 2, there is disclosed a method for manufacturing a luminescent device utilizing the chemical lift-off technology. With these manufacturing methods, an n-type layer, a p-type layer, and a p-side electrode are sequentially formed on a sapphire substrate, which is followed by newly forming a conductive supporting substrate on the side of the p-side electrode, and peeling-off the sapphire substrate.

With a vertical type luminescent device based on such a lift-off technology, a supporting substrate made of another material which is optimized in thermal conductivity, and the like, can be used, whereby a high heat dissipation and reliability can be obtained.

CITATION LIST

Patent Literature

Patent Document 1
 Japanese Unexamined Patent Application Publication No, 2008-53685
Patent Document 2
 Domestic Re-publication of PCT International Application No. 2006-126330

DISCLOSURE OF THE INVENTION

Problems to be Solved by the Invention

The chemical lift-off technology is excellent in productivity and less damage to the luminescent layer, as compared to the laser lift-off technology. However, unlike the laser lift-off technology, the chemical lift-off technology requires that, at the time of peeling off the compound semiconductor layer forming a luminescent device from the epitaxial substrate, an etchant be supplied to the lift-off layer for etching the lift-off layer from the circumference thereof where the etchant is brought into contact therewith. Therefore, it has been found that a problem is presented that, during gradual peeling-off the lift-off layer from the compound semiconductor layer, cracks are initiated in the compound semiconductor layer, resulting from the internal stress generated by the difference in lattice constant and thermal expansion coefficient between the dissimilar epitaxial substrate and the compound semiconductor layer at the time of growth being concentrated in the portion which has not yet been peeled off.

In view of the aforementioned problem, it is an object of the present invention to provide a luminescent device and a manufacturing method for a semiconductor device including the luminescent device which are free from occurrence of cracks in a compound semiconductor layer due to the internal stress in the compound semiconductor layer at the time of chemical lift-off.

Means for Solving the Problems

In order to achieve the aforementioned object, the luminescent device and the manufacturing method for the luminescent device and the semiconductor device in accordance with the present invention are configured as follows.

The first manufacturing method for a semiconductor device (corresponding to claim 1) is a manufacturing method for a semiconductor device, comprising: a device region formation step of forming a device region constituted by a semiconductor layer on part of an epitaxial substrate through a lift-off layer; a sacrificing portion formation step of forming a sacrificing portion, being not removed in a later-mentioned chemical lift-off step, around the device region on the epitaxial substrate; a covering step of forming a covering layer, covering the epitaxial substrate except part on the semiconductor and on the sacrificing layer; a foundation layer formation step of forming a foundation layer on a surface on the epitaxial substrate including part on the semiconductor and on the sacrificing layer and a covering layer surface; a plating step of forming a supporting substrate by providing plating on the foundation layer; a covering layer removing step of dissolution removing of the covering layer; a chemical lift-off step of separating between the semiconductor layer and the epitaxial substrate by dissolution removing of the lift-off layer; and a sacrificing portion removing step of separating between the epitaxial substrate and the foundation layer at the sacrificing portion after the chemical lift-off step.

The first manufacturing method for a luminescent device (corresponding to claim 2) is a manufacturing method for a luminescent device including a semiconductor layer having a luminescent layer, comprising: a device region formation step of forming a device region constituted by the semiconductor layer on part of an epitaxial substrate through a lift-off layer; a sacrificing portion formation step of forming a sacrificing portion, being not removed in a later-mentioned chemical lift-off step, around the device region on the epitaxial substrate; a covering step of forming a covering layer, covering the epitaxial substrate except part on the semiconductor and on the sacrificing layer; a foundation layer formation step of forming a foundation layer on a surface on the epitaxial substrate including part on the semiconductor and on the sacrificing layer and a covering layer surface; a plating step of forming a supporting portion by providing plating on the foundation layer; a covering layer removing step of dissolution removing of the covering layer; a chemical lift-off step of separating between the semiconductor layer and the epitaxial substrate by dissolution removing of the lift-off layer; and a sacrificing portion removing step of separating between the epitaxial substrate and the foundation layer at the sacrificing portion after the chemical lift-off step.

The second manufacturing method for a luminescent device (corresponding to claim 3) is the aforementioned method, wherein preferably, in the device region formation step, the semiconductor layer includes an n-type layer, a luminescent layer, and a p-type layer, being constituted by a group III nitride semiconductor, in this order from the epitaxial substrate side.

The third manufacturing method for a luminescent device (corresponding to claim 4) is the aforementioned method, wherein preferably, in the covering step, a photoresist is coated for making a covering such that the level of the covering layer surface from the epitaxial substrate at least on the sacrificing portion is lower than the luminescent layer, and part of the covering layer on the semiconductor layer and the sacrificing portion is removed by photolithography.

The fourth manufacturing method for a luminescent device (corresponding to claim 5) is the aforementioned method, wherein preferably, in the foundation layer formation step, the foundation layer includes a reflection layer on the semiconductor layer side.

The first luminescent device (corresponding to claim 6) is a luminescent device manufactured by any one of the aforementioned first to fourth manufacturing methods for a luminescent device.

The second luminescent device (corresponding to claim 7) is a luminescent device having a semiconductor layer including a luminescent layer on a supporting substrate, the supporting substrate having a concave shape, the semiconductor layer being connected to the bottom of the concave shape through a foundation layer, and the supporting substrate having a discontinuously independent convex portion constituted by the foundation layer at the summit of the concave shape.

The third luminescent device (corresponding to claim 8) is a luminescent device having the aforementioned configuration, wherein preferably the leakage current flowing when a reverse voltage of 10 volts is applied is less than 10 μA.

Advantages of the Invention

In accordance with the present invention, there can be provided a luminescent device and a manufacturing method for the luminescent device and a semiconductor device which are free from occurrence of cracks in the compound semiconductor layer due to the internal stress between the epitaxial substrate and the compound semiconductor layer at the time of chemical lift-off.

BEST MODE FOR CARRYING OUT THE INVENTION

Hereinafter, a preferred embodiment (Example) of the present invention will be explained with reference to the accompanying drawings.

Figure 1A:
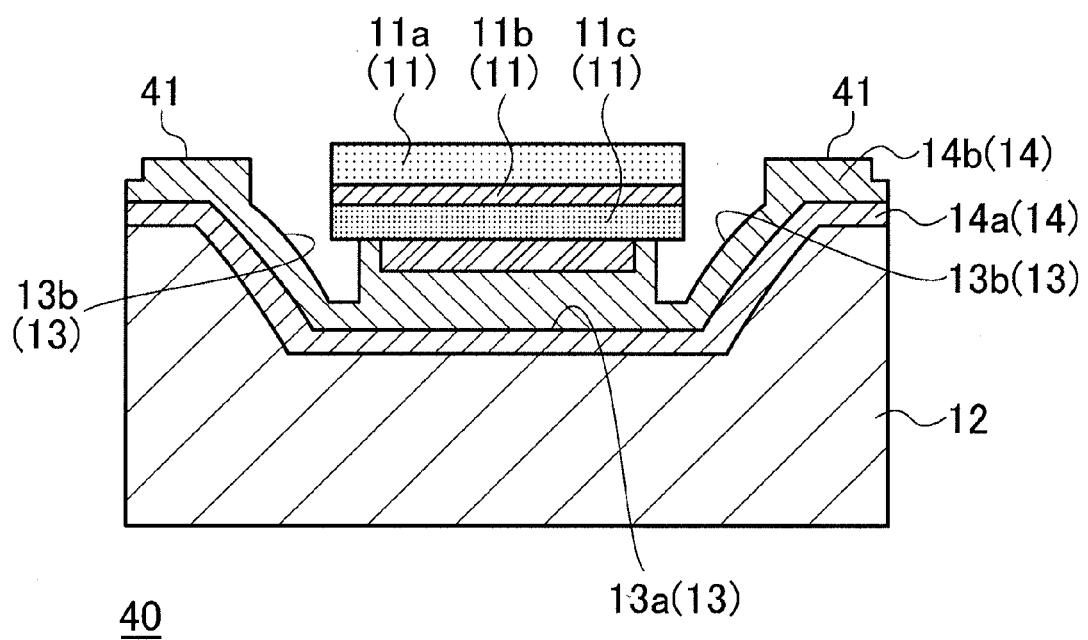
FIG. 1 (a) to FIG. 1(b) are sectional views of a luminescent device according to the present embodiment of the present invention.
Figure 1B:
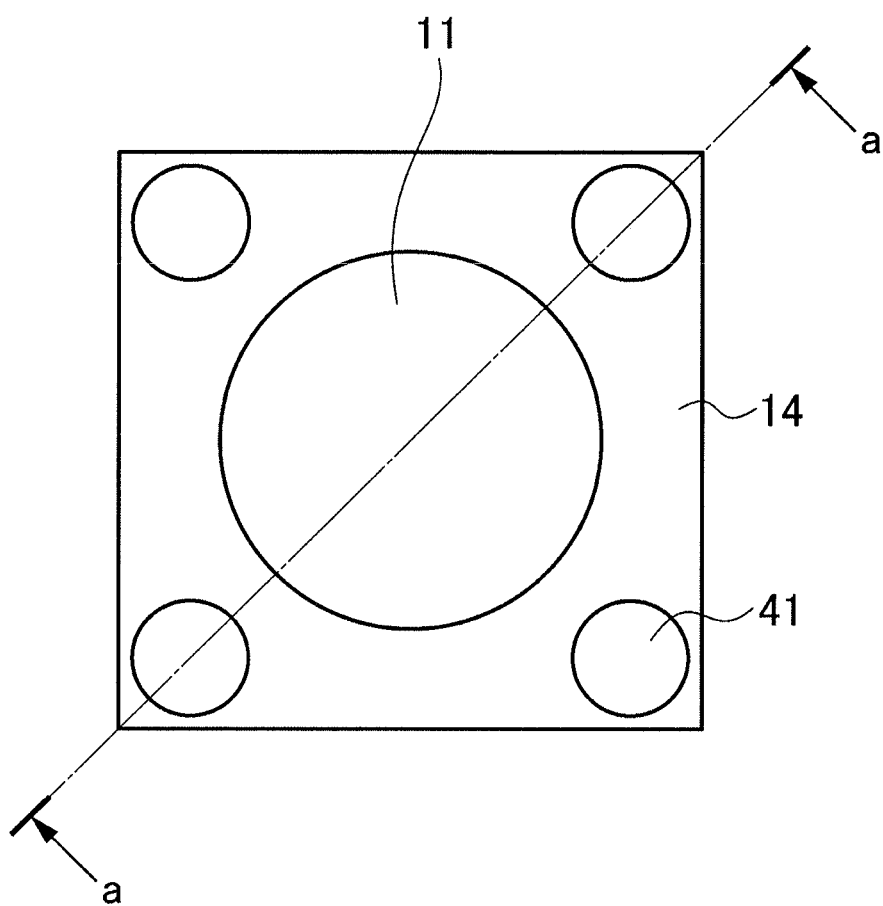

FIG. 1 (a) is a sectional view of a luminescent device according to the present embodiment of the present invention, FIG. 1 (b) being a top view of the same. A luminescent device 40 has a configuration in which a semiconductor layer 11 including a luminescent layer 11b is supported by a supporting substrate 12. In the luminescent device 40, the supporting substrate 12 is formed by plating. The supporting substrate 12 is concave shaped, a concave portion 13 comprised of a flat bottom face (flat portion) 13a and a tapered side face 13b being formed thereon, and on the surface thereof, a reflection layer 14b being formed. Further, the semiconductor layer 11 of the luminescent device 40 is placed on the flat portion 13a, and is formed such that the level of the surface of a foundation layer 14 in the region away from the flat portion 13a is higher than the luminescent layer 11b. Thereby, the light having reached the side face 13b from the luminescent layer 11b is reflected by the reflection layer 14b, thereby being provided with a component which is emitted in a normal line direction of the flat portion 13a. Furthermore, this luminescent device 40 has a convex portion 41 which is part of the side face 13b, being formed by the foundation layer 14, in a location which provides a summit of the concave portion 13. This convex portion 41 is a columnar portion which maintained bonding by means of a sacrificing portion in the chemical lift-off process.

The semiconductor layer 11 of the luminescent device 40 includes the luminescent layer 11b between an n-type GaN layer (n-type semiconductor layer: n-type layer) 11a and a p-type GaN layer (p-type semiconductor layer: p-type layer) 11c. On the p-type GaN layer 11c, a p-side electrode 23 is formed.

The supporting substrate 12 of the luminescent device 40 is formed by, for example, Ni plating or Cu plating. In addition, in FIG. 1 (a), a seed layer 14a for use in forming the supporting substrate 12 is shown. As the seed layer 14a, which is on the plating side of the foundation layer 14, palladium (Pd) is used for Ni plating, while, for Cu plating, platinum (Pt)/cupper (Cu) is used.

As the reflection layer 14b of the luminescent device 40, it is preferable to use rhodium or ruthenium. This is because rhodium or ruthenium has a high reflectivity for the wavelength region of a group III nitride, and is hard to be etched by an etchant for chemical lift-off.

According to the aforementioned configuration, the luminescent device 40 allows the light having reached to the side face 13b from the luminescent layer 11b to be reflected by the reflection layer 14b and the convex portion 41, thereby being provided with a component which is emitted in a normal line direction of the flat portion 13a, whereby the light can be taken out sufficiently effectively; contrarily to this, in the case where a conventional flat supporting substrate is used, the light emitted from the luminescent layer in a lateral direction leaks laterally, thereby the light cannot be taken out with a sufficient effectiveness.

In addition, unlike a structure which provides a reflection portion in a side direction of the semiconductor layer through an insulating film on a conventional supporting substrate, the luminescent device 40 according to the present embodiment has a configuration which provides the reflection layer 14 directly on the supporting substrate 12 not through an insulating film on the supporting substrate 12. Thereby, the luminescent device 40 is simple in construction, and as explained below, can be easily manufactured.

Hereinbelow, the manufacturing method for the luminescent device 40 according to the present embodiment of the present invention will be explained. The n-type or p-type semiconductor layer 11 used in this luminescent device 40 can be obtained by epitaxially growing it on the epitaxial substrate. However, with a luminescent device 40 actually fabricated, this epitaxial substrate is removed, and a supporting substrate 12 which is different from the epitaxial substrate is connected on the side opposite to the side where the epitaxial substrate has been given.

Figure 2:
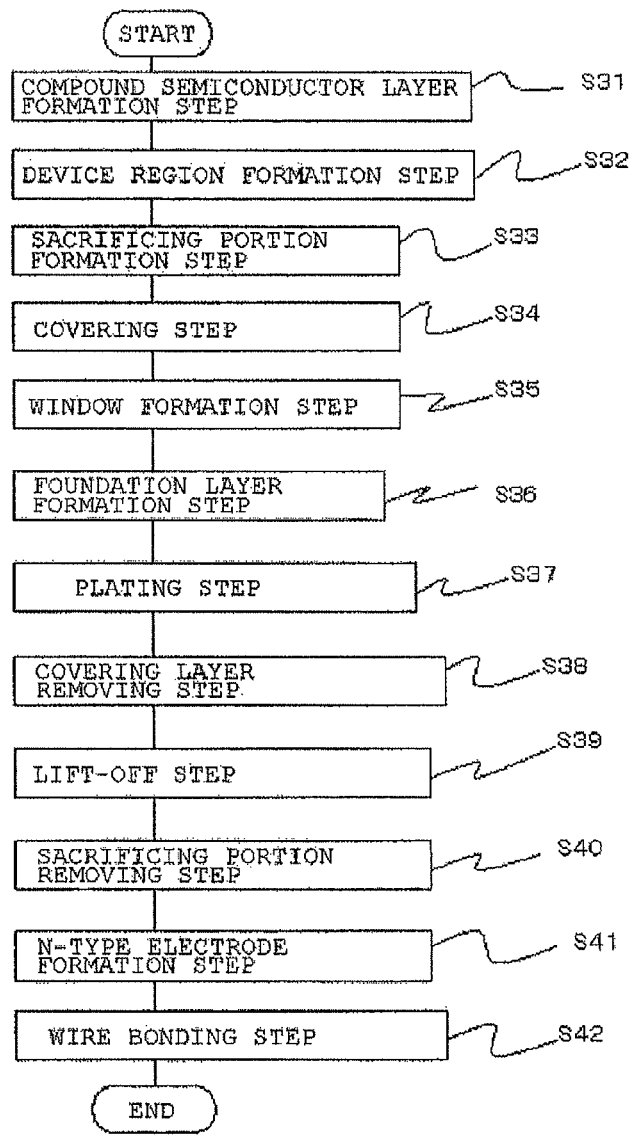
FIG. 2 is a flowchart showing the steps of manufacturing a luminescent device according to the present embodiment of the present invention.
Figure 3A:
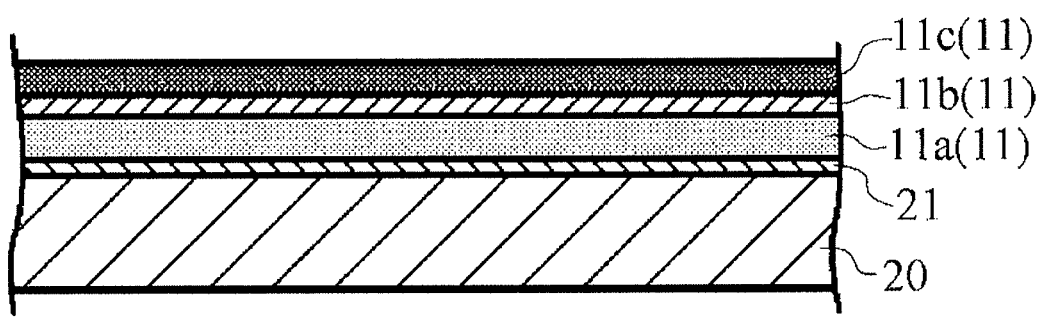
FIG. 3 (a) to FIG. 3(f) are sectional views of a substrate in the respective steps of the method for manufacturing a luminescent device according to the present embodiment of the present invention.
Figure 3B:
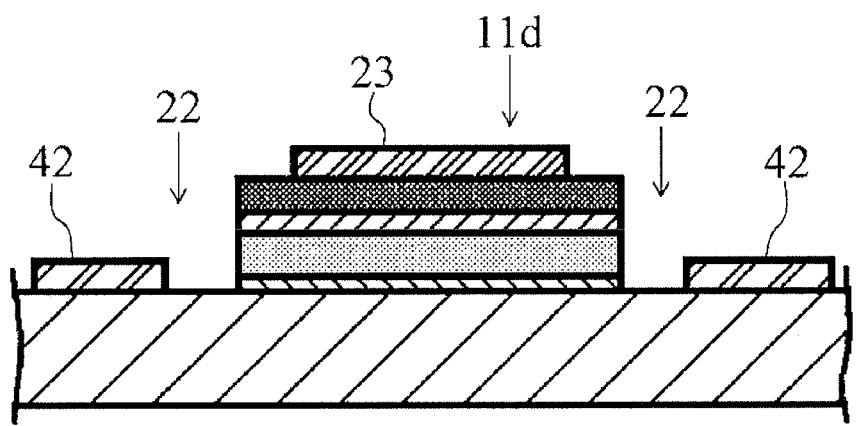
Figure 3C:
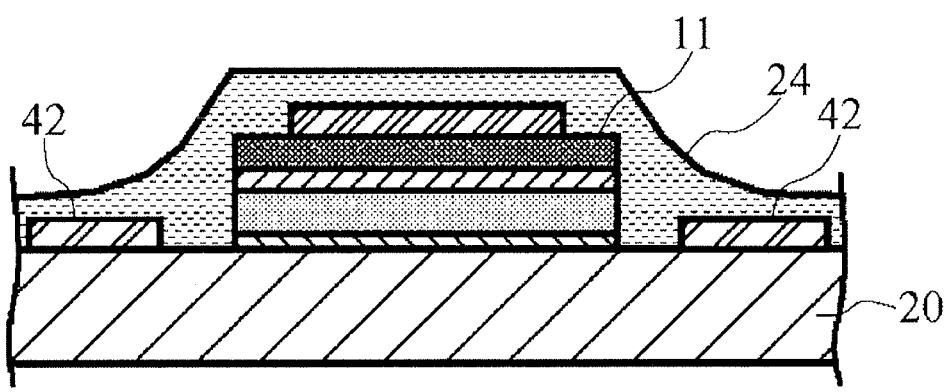
Figure 3D:
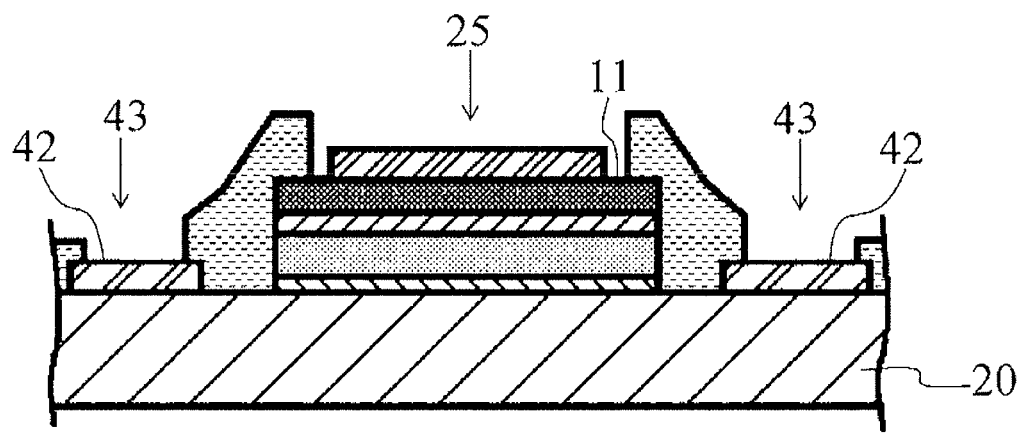
Figure 3E:
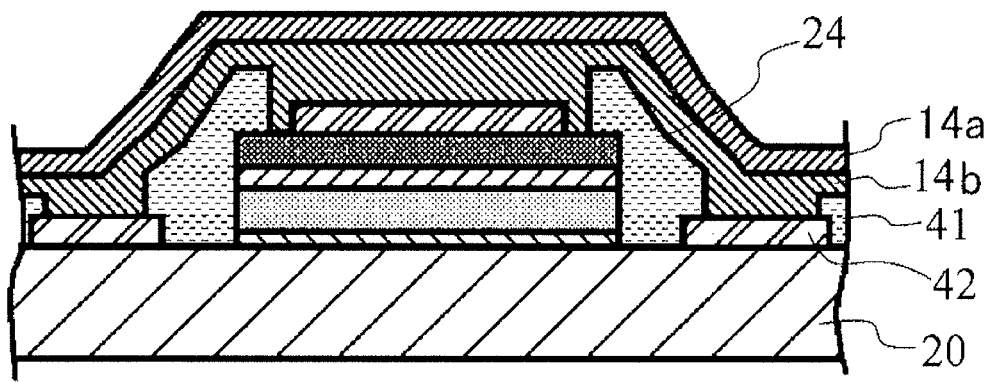
Figure 3F:
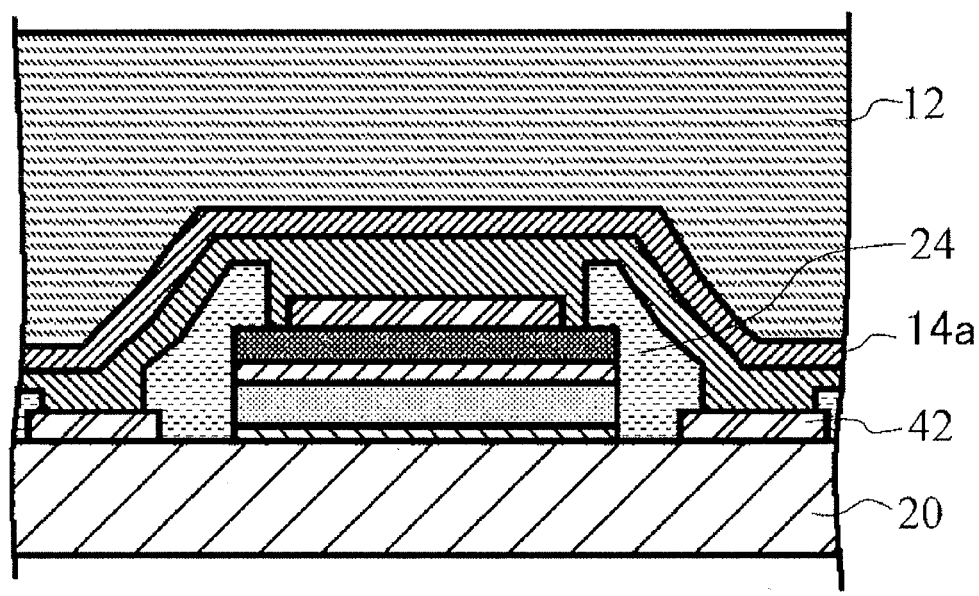

FIG. 2 is a flowchart showing the steps of manufacturing a luminescent device according to the present embodiment of the present invention. FIG. 3 (a)-(f) and FIG. 4 (g)-(i) are sectional views of a substrate in the respective steps of the method for manufacturing a luminescent device according to the present embodiment of the present invention. Herein, the case where, as this luminescent device, a light-emitting diode (LED) made of a gallium nitride based material is manufactured will be described. This LED is a laminate of an n-type layer, a luminescent layer, and a p-type layer, and in FIG. 1 (a)-(b), a structure of one device of an LED is shown, however, actually, a plurality of LEDs can be formed on a single supporting substrate, and after formation of a plurality of devices, these can be separated into individual devices, or can be connected in series or parallel for use.

The method of manufacturing a semiconductor device according to the present embodiment has a compound semiconductor layer formation step (step S31), a device region formation step (step S32), a sacrificing portion formation step (step S33), a covering step (step S34), a window formation step (step S35), a foundation layer formation step (step S36), a plating step (step S37), a covering layer removing step (step S38), a chemical lift-off step (step S39), a sacrificing portion removing step (step S40), an n-type electrode formation step (step S41), and a wire bonding step (step S42).

In the compound semiconductor layer formation step (step S31), a lift-off layer (a metal buffer layer) and a compound semiconductor layer on the lift-off layer are formed on an epitaxial substrate. First, as shown in FIG. 3 (a), a lift-off layer 21 is formed on an epitaxial substrate 20. As the epitaxial substrate 20, an MN template substrate (a substrate having an AlN layer on a surface of sapphire) is particularly preferably used. In addition, as the lift-off layer thereon, scandium (Sc) or chrome (Cr) can be used, for example. Film formation of the lift-off layer 21 can be performed by the sputtering method, the vacuum evaporation method, or the like.

Next, in this state, by making such a nitriding treatment as heating in an ammonia atmosphere, the lift-off layer 21 is nitrided to be a scandium nitride layer (a metal nitride layer: ScN layer) or a chrome nitride layer (a metal nitride layer: CrN layer). Hereinafter, the case where Sc (an ScN layer) is used for the lift-off layer 21 will be cited as an example for explanation.

Next, on the lift-off layer 21, an n-type GaN layer (n-type semiconductor layer: n-type layer) 11a, a luminescent layer 11b, and a p-type GaN layer (p-type semiconductor layer: p-type layer) 11c are sequentially deposited (an epitaxial growth step). This film formation is performed by, for example, the metal organic chemical vapor deposition process (MOCVD process), an impurity serving as a donor being doped into the n-type layer 11a, while an impurity serving as an acceptor into the p-type layer 11c.

In the device region formation step (step S32), at least part of the compound semiconductor layer (laminate) 11 is removed by etching to form a device region 11d and a separation groove 22 concurrently (FIG. 3 (b)). As shown in FIG. 3 (b), the separation groove 22 has a depth ranging from the upper side (the p-type layer 11c side) in FIG. 3 to the surface of the epitaxial substrate 20. Thereby, the laminate 11 is divided on the substrate 20. In FIG. 3 (b), a section in one direction is shown, however, this separation groove 22 is also formed in a direction different therefrom, a device region 11d surrounded by the separation groove 22 being formed in a plurality of regions. Thereby, an etchant for chemical lift-off can be supplied to the lift-off layer in the respective device regions. The device region 11d is preferably circular. This is because, at the time of etching in the chemical lift-off process, the region which is not yet dissolved is uniformly reduced in size, and initiation of cracks due to the stress concentration in the circumferential portion of the device region can be suppressed. The lines used for device separation is preferred to be made to form polygonal shape, particularly preferably quadrangular shape. This is because such a geometry facilitates device separation by dicing, or the like, and is used for formation of a sacrificing portion.

Formation of the separation groove 22 is performed in the following way, for example. $SiO_2$ is deposited on the compound semiconductor layer 11 by the CVD process; a resist is used to perform patterning; and etching is made with BHF to form a mask of $SiO_2$. Thereafter, using $SiO_2$ as a mask, the compound semiconductor layer is dry-etched until the epitaxial substrate is exposed. Thereafter, BHF is used to remove the $SiO_2$ mask.

Next, on the entire face of the p-type layer 11c located at the uppermost face, a material which can make an ohmic contact with the p-type layer 11c is deposited as a p-side electrode 23. For example, Ni/Au (50 Å/200 Å) is deposited by sputtering or deposition, and annealed.

In the sacrificing portion formation step (step S33), a sacrificing portion 42 which is formed of a material which will not be removed in the chemical lift-off step, and has a level lower than the surface of the semiconductor layer 11 is formed around the device region on the epitaxial substrate 20. As the material of the sacrificing portion 42, any material which can secure the adherence to the epitaxial substrate 20 and the later-formed foundation layer 14, will not be removed in the chemical lift-off step, and can be easily removed without having an adverse effect on the others after the chemical lift-off step can be used, and for example, chrome (Cr) or silicon dioxide ($SiO_2$) can be used.

The area around the device region on the epitaxial substrate 20 is an area which is not continuous to the device region on the epitaxial substrate exposed by the separation groove 22, and is required to be disposed discontinuously and independently in a location symmetrical with respect to the device region. This is because, if the sacrificing portion 42 closes up the lift-off layer 21 from the outside, the path for inflow of the etchant in the chemical lift-off step is blocked, thereby the chemical lift-off taking more time, resulting in the productivity being deteriorated.

In the covering step (step S34), it is preferable to cover the epitaxial substrate 20, the semiconductor layer 11, and the sacrificing portion 42 to form a covering layer 24 such that the level of the surface thereof in the region away from the device region is lower than the surface of the luminescent layer 11*b* (FIG. 3 (*c*)). As the covering layer 24, it is preferable to use a photoresist which allows the aforementioned geometry to be obtained according to the coating conditions, and which can be easily dissolved and removed.

By making the level of the film surface lower than the surface of the luminescent layer 11*b* with the epitaxial substrate side being directed downward, the level of the side face 13*b* of the reflection layer 14 after the upside-down reversal in the chemical lift-off step is higher than the luminescent layer 11*b* in the region away from the device region with the supporting substrate side being directed downward. Thereby, the emitted light directed from the active layer toward a horizontal direction is reflected at the side face 13*b* to permit it to be taken out in a vertical direction. In the figure, the area which has the sacrificing portion is used for explanation, however, also in the area which has no sacrificing portion, it is preferable to form a covering layer 24 such that the level of the surface of the covering layer 24 in the region away from the device region is lower than the surface of the luminescent layer 11*b*. In other words, it is preferable that, after separating the device region as an individual device, the level of the side face 13*b* of the reflection layer 14 surrounding the active layer of the device region be higher than that of the luminescent layer 11*b* throughout the entire angle of 360 deg in a horizontal direction of the active layer with the supporting substrate being directed downward.

In the window formation step (step S35), the covering layer 24 on the semiconductor layer 11 and that on the surface of the sacrificing portion 42 are removed to form a window 25 and a window 43 (FIG. 3 (*d*)). This window formation step (step S35) is performed by the photolithography if the covering step uses a photoresist. Any method may be used, provided that it can cover the epitaxial substrate as described above, except part on the semiconductor layer and on the sacrificing portion, and the window formation step and the covering step may be handled as a covering step without differentiating them as in the present embodiment.

In the foundation layer formation step (step S36), a foundation layer 14 is formed on the surface of the covering layer 24 and the surface of the semiconductor layer 11 (including the surface of the p-side electrode 23), and on the sacrificing portion 42. The foundation layer has a good adherence to the semiconductor layer 11 and the sacrificing portion 42, and plays a role of a seed in the plating process. It is preferable that the semiconductor side of the foundation layer be not etched by the respective etchant for the covering layer, the lift-off layer, and the sacrificing portion. Further, in the case where the foundation layer 14 is to be provided with a reflection function for light from the luminescent layer, it can be comprised of a seed layer 14*a* and a reflection layer 14*b*; the surface on the semiconductor layer side of the reflection layer 14*b* in that case may be formed of a platinum group metal, such as rhodium or ruthenium; and in the foundation layer formation step (step S36), the reflection layer 14*b* and the seed layer 14*a* can be formed from the semiconductor layer side in this order (FIG. 3 (*e*)). As the seed layer 14*a*, it is preferable that, in the case where Ni plating is to be used in the subsequent plating step, palladium (Pd) be used for the surface on the plating side, while, in the case where Cu plating is to be used in the subsequent plating step, Pt/Cu be used for the surface on the plating side. Part of the foundation layer 14 that has formed a bonding to the sacrificing portion 42 provides a convex portion 41.

In the plating step (step S37), a supporting substrate 12 is formed by providing plating on the reflection layer 14 (FIG. 3 (*f*)). Any plating metal may be used, provided that it can be plated, and is different from the lift-off layer and the sacrificing portion, and it is preferable to use Ni plating or Cu plating. The plating process may be of dry type or wet type.

Figure 4G:
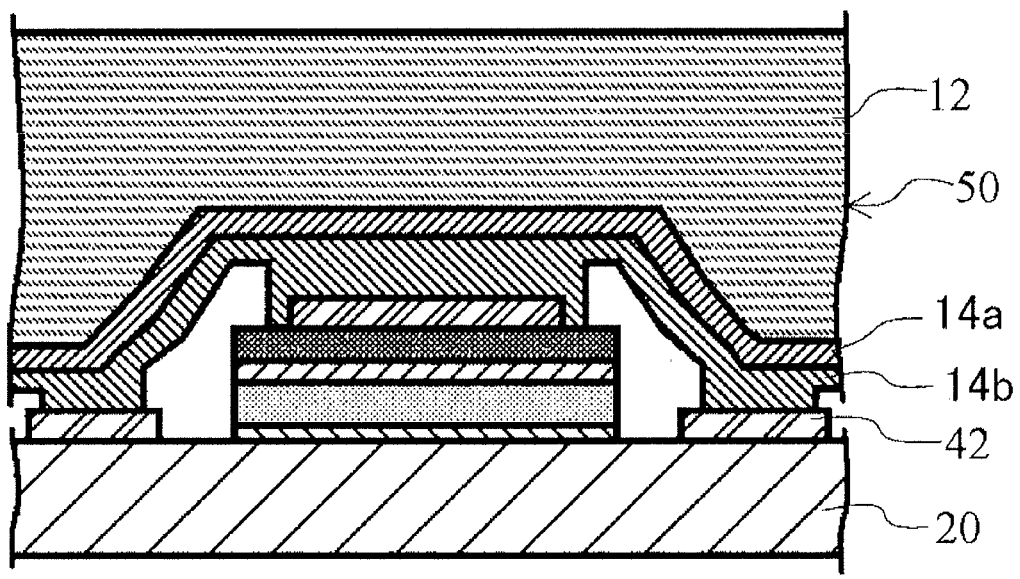
FIG. 4(g) to FIG. 4(i) are sectional views of a substrate in the respective steps of the method for manufacturing a luminescent device according to the present embodiment of the present invention.
Figure 4H:
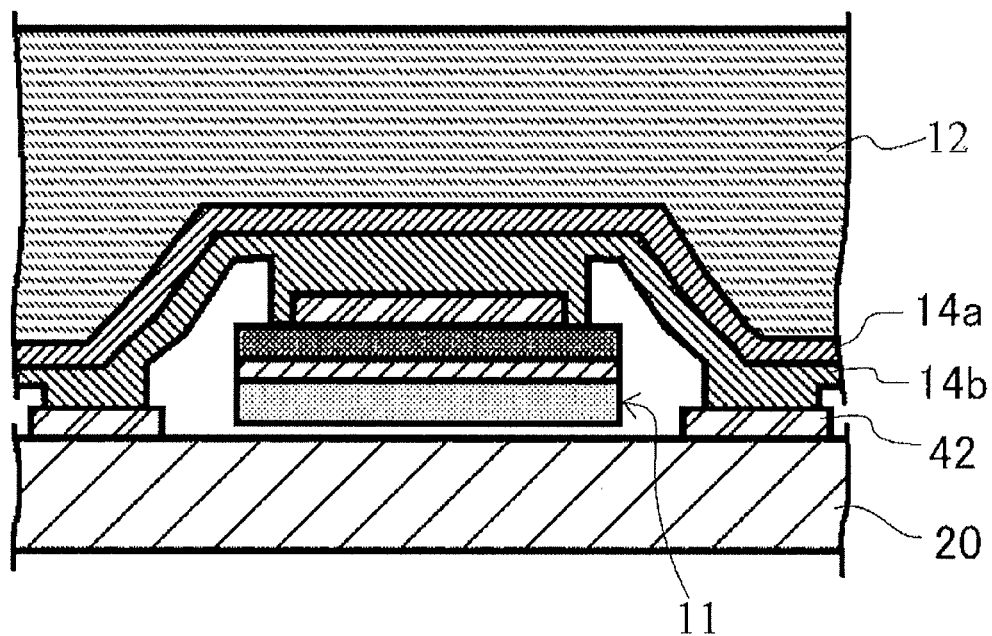
Figure 4I:
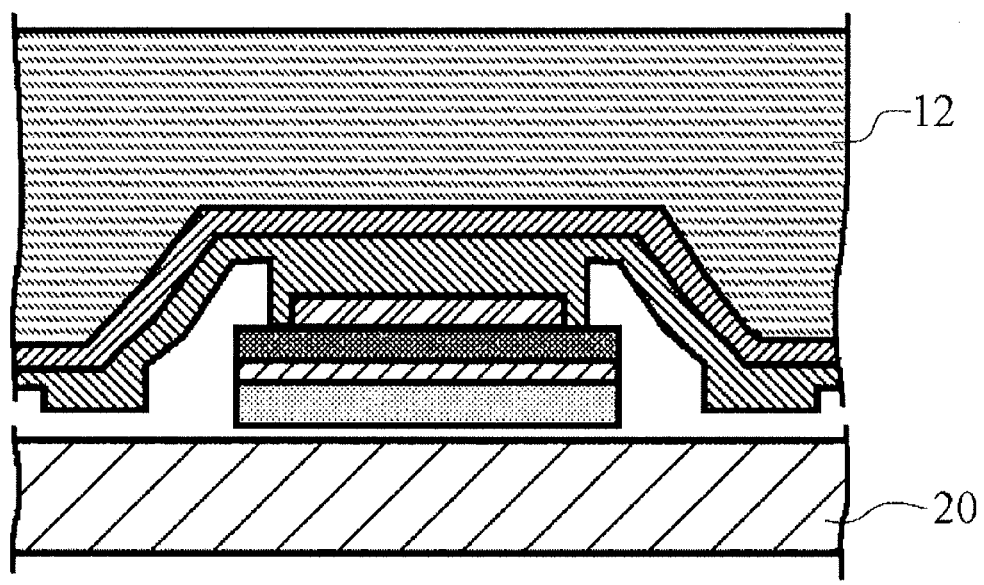

In the covering layer removing step (step S38), the covering layer 24 is removed (FIG. 4 (*g*)). By soaking in the photoresist remover, the gap between the semiconductor layer 11 and the epitaxial substrate 20 that is closed up by the covering layer 24 is recovered to form a path for inflow of the etchant in the later chemical lift-off step. Any photoresist remover may be used, provided that there is no adverse effect at least on the sacrificing portion, or the like; the photoresist remover is selected according to the type of the photoresist; and an organic solvent, such as acetone, or the like, can be utilized.

In the chemical lift-off step (step S39), the semiconductor layer 11 and the epitaxial substrate 20 are separated from each other (FIG. 4 (*h*)). The chemical lift-off step (step S39) performs chemical etching by soaking the substrate 50 formed by plating in, for example, hydrochloric acid for performing chemical etching to dissolve the lift-off layer 21 (FIG. 4 (*h*)). In this chemical lift-off step (step S39), the semiconductor layer 11 can be peeled off from the epitaxial substrate 20 such that no cracks are initiated, because the convex portion 41 of the side face and the sacrificing portion 42 are bonded to be like a column, thereby the deformation on the epitaxial substrate side and the semiconductor layer side being suppressed and the stresses imposed on the semiconductor layer being relieved, even if the portion which has not yet been dissolved is reduced in size by etching the lift-off layer 21.

The sacrificing portion removing step (step S40) uses a selective etchant for Cr (cerium ammonium nitrate), for example, in the case where the sacrificing portion is Cr, and BHF (buffered hydrofluoric acid), for example, in the case where the sacrificing portion is silicon dioxide ($SiO_2$) for performing chemical etching to thereby dissolve the sacrificing portion 42 for peeling off the epitaxial substrate 20. Since the semiconductor layer has already been separated by the chemical lift-off, the sacrificing portion which maintains bonding can be mechanically peeled off, however, use of etching makes it difficult for an unnecessary deposit to occur, thus it is desirable to use etching.

After the sacrificing portion removing step, by passing through the n-type electrode formation step (step S41), a device separation step (not shown) by dicing, or the like, with the device separation scheduled line, and the wire bonding step (step S42), a vertical type LED (semiconductor device) which allows the light to be effectively taken out can be manufactured. It is more preferable to form a protection film which covers the entire device region except on the n-type electrode. This is for preventing occurrence of a leak between the side face 13b of the supporting substrate and the semiconductor layer.

The aforementioned embodiment has been explained using an AlN template substrate as the epitaxial substrate 20, however, as the epitaxial substrate 20, besides the AlN template substrate, any other material, such as sapphire, SiC, or the like, can be used, provided that it allows a good-quality group III nitride semiconductor (the n-type layer 11a, the luminescent layer 11b, the p-type layer 11c), such as GaN or AlN, AlGaN, BAlInGaN, or the like, to be grown through the buffer layer 21, or the like. A similar group III nitride substrate may be used, however, using a dissimilar material, such as sapphire, SiC, or the like, which generates less internal stress, is particularly effective as a way of controlling the internal stress in the case where lift-off is to be performed using an epitaxial substrate which generates internal stress between it and a semiconductor layer to be grown, in other words, a dissimilar epitaxial substrate.

The aforementioned example was explained on the assumption that the laminate is constituted by the n-type layer 11a, the luminescent layer 11b, and the p-type layer 11c which are all formed of a GaN based material. However, it is obvious that, even in another case, the same advantages are obtained. For example, it is also obvious that a semiconductor device, such as an HEMT, a diode utilizing a simple pn junction, a light-emitting diode (LED), in which a luminescent layer (active layer) is provided between an n-type layer and a p-type layer, and a laser diode can be manufactured in the same manner. In addition, the n-type layer and the p-type layer may be made of another group III nitride substrate, for example, $Al_aIn_bGa_{1-a-b}N$ ($0 \leq a \leq 1$, $0 \leq b \leq 1$, $a+b \leq 1$), in place of GaN. In the case of a luminescent device, in the epitaxial growth step, the n-type layer 11a, the active layer, and the p-type layer 1 is are formed in this order, for example.

In the aforementioned embodiment, explanation was made using Sc as the lift-off layer 21 in the compound semiconductor layer formation step (step S31), however, in the case where Cr is used as the lift-off layer 21, for example, sodium permanganate, potassium permanganate, or the like, can be used as the lift-off layer etchant which is to be used in the chemical lift-off step (step S39). At that time, as the sacrificing layer 42 in the sacrificing portion formation step (step S33), $SiO_2$ can be used in place of Cr. And at that time, as the sacrificing layer etchant which is to be used in the sacrificing portion removing step (step S40), BHF can be used. Thus, according to the type of the lift-off layer 21, the type of sacrificing layer and etchant that allows bonding to be maintained without being etched in the chemical lift-off step is selected.

Example

On the face of an AlN (0001) template substrate which has been obtained by growing an AlN single crystal layer (having a thickness of 1 μm) on sapphire using the MOCVD process, scandium (Sc) was deposited by the sputtering method to a film thickness of 100 Å as a lift-off layer.

Next, in the ammonia atmosphere, nitriding treatment was performed at 1200° C. for 10 minutes, thereby the lift-off layer was nitrided, a scandium nitride layer (ScN layer) being formed.

Next, on the ScN layer, non-doped AlGaN of 2 μm, a Si-doped n-type AlGaN layer (1.5 μm), an MQW active layer (0.1 μm), and a Mg-doped p-type AlGaN layer (0.3 μm) were sequentially deposited by the MOCVD process.

$SiO_2$ was deposited on the p-type AlGaN layer by the CVD process; a resist was used for patterning; with BHF, etching was performed to form a $SiO_2$ mask; and the compound semiconductor layer was dry-etched until the AlN template substrate was exposed.

Thereafter, BHF was used to remove the $SiO_2$ mask; a circular device region having a diameter of 850 μm was formed. Next, on the p-type layer in the device region, Ni/Au. (50 Å/200 Å) was deposited as a p-side electrode, and annealed at 550° C. for 15 minutes.

In the sacrificing layer formation step, a Cr (200 Å) layer having a diameter of approx. 95 μm was formed at the four corners as a sacrificing layer, being spaced away from the device region on the AlN template substrate which has been exposed by dry etching.

In the covering layer formation step, a photoresist was spin-coated as a covering layer, and patterning was performed such that the device region and the sacrificing layer were exposed. The exposed portion in the device region has a diameter of 840 μm, and the sacrificing layer has a diameter of 90 μm. The thickness of the photoresist which was left on the circumference of the sacrificing layer after the patterning was approx. 2 μm, and the level of the photoresist surface from the epitaxial substrate was lower than that of the active layer.

On the covering layer, and on the exposed device region and sacrificing layer, Pt/Au/Pt/Pd (250 Å/5500 Å/250 Å/150 Å) was deposited in this order as a foundation layer by the sputtering method. Thereafter, on the foundation layer, Ni plating was performed using a. commercially available Ni electroless plating fluid to form a Ni supporting substrate having a thickness of 100 μm from the flat bottom portion.

In the covering layer removing step, the photoresist of the covering layer was removed by soaking it in acetone.

In the chemical lift-off step, the epitaxial substrate and the semiconductor layer were separated from each other. By soaking the lift-off layer in hydrochloric acid for 24 hr, the chemical etching of it was performed, and by removing the lift-off layer, the AlN template substrate and the semiconductor layer were separated from each other. In this chemical lift-off step, the sacrificing layer is not removed by the etchant, and thus the connection between the AlN template substrate and the Ni supporting substrate was maintained through the sacrificing layer and the foundation layer.

After the chemical lift-off step, in the sacrificing layer removing step, the sacrificing layer was soaked in a cerium ammonium nitrate solution to etch away it to separate the supporting substrate (foundation layer) and the AlN template substrate from each other.

Comparative Example

Operations were carried out as in Example, except that no sacrificing layer was formed, and in the covering layer formation step, patterning of the photoresist was performed such that only the device region was exposed. In the chemical lift-off step, the supporting substrate and the AlN template substrate were separated from each other, the sacrificing layer removing step being not provided.

Figure 5:
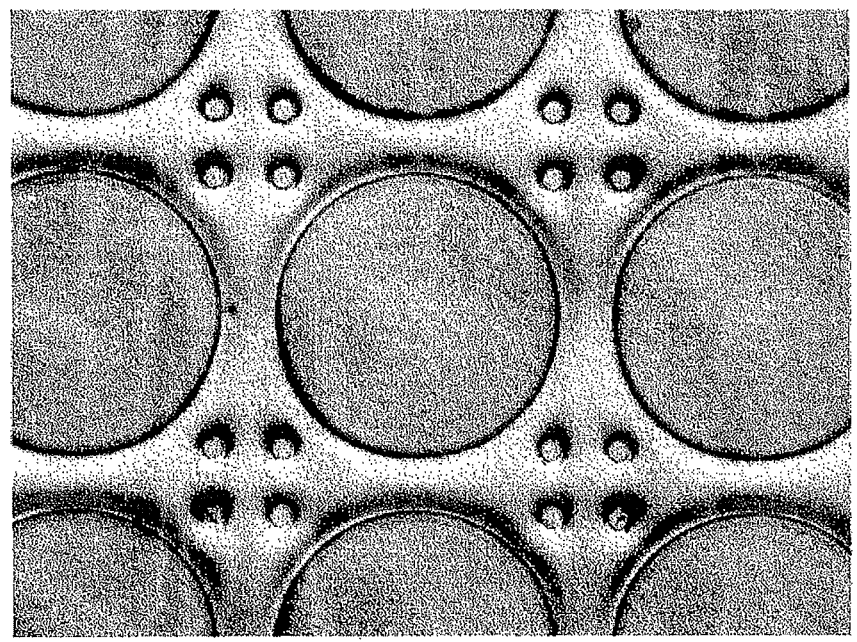
FIG. 5 is an electron microscope photograph taken in the observation of the surface of a compound semiconductor layer on the supporting substrate side after the sacrificing layer removing step according to the present embodiment of the present invention.

The quality of the compound semiconductor layer after peeling off the MN template substrate in Example and that in Comparative Example were compared with each other by surface observation with an optical microscope. In Comparative Example as shown in FIG. 5, after the substrate peeling off, it was observed with a metallurgical microscope and an electron microscope that, with nine of the ten samples, there initiated cracks in the central portion of the compound semiconductor layer after the AlN template substrate peeling off.

It can be supposed that the compound semiconductor layer was etched from the circumferential portion, and in a miniature region left in the central portion just before the AlN template substrate was peeled off, there occurred a stress concentration between the substrate and the compound semiconductor layer and supporting substrate, thereby after the peeling, cracks were observed. However, in Example, as shown in FIG. 5, cracks as in Comparative Example were not observed in the compound semiconductor layer. It can be supposed that the sacrificing layer portion, which plays a role as a column between the epitaxial substrate and the semiconductor layer in the chemical lift-off step, suppresses the deformation, thereby the stress imposed on the semiconductor layer on the device region side surrounded by the columns is greatly alleviated in comparison with Comparative Example, thereby cracks are prevented from being initiated on the device region side. Therefore, it was found that, in Example, no cracks will be caused at the time of AlN template substrate peeling-off, and in the compound semiconductor layer, which is to be lifted-off by etching the lift-off layer from the periphery, occurrence of cracks can be suppressed in a place where stresses would be concentrated as the etching is progressed.

In addition, with the samples prepared in Example and Comparative Example, part of the non-doped AlGaN layer in the peeled-off compound semiconductor layer was further dry-etched to be removed in the range required for formation of n-type electrode, and Ti/Al was formed in this order on the exposed n-type AlGaN layer to form an n-type electrode, and an I-V measurement was made using a constant current voltage measuring instrument. At a reverse voltage Vr (−10 μA), Example exhibited over 10 V, while, the samples with which cracks were observed in Comparative Example as low as approx. 6 V. It can be supposed that, in. Comparative Example, occurrence of cracks increased the leakage current. Thus it has been found that, in accordance with the present invention, a high-quality luminescent device exhibiting a smaller leakage current can be obtained.

The structure, geometry, size and positional relationship as explained in the aforementioned embodiment have been only schematically given to such a degree that the present invention can be understood and implemented, and the numerical values and the composition, and the like, of each structure have been only exemplified. The technique which prevents occurrence of cracks at the time of chemical lift-off is a necessary technique for not only the luminescent device, but also for the whole types of semiconductor devices. Therefore, the present invention is not limited to the embodiment which has been explained, and may be modified to various forms so long as there is no departure from the range of the technical concept as given in the scope of claim for patent.

However, in order to implement the present invention, it is necessary to obtain, from among the limited number of materials which can be used as a semiconductor device, the material composition of the present invention that meets the requirements for each selective etching fluid and the resistance to the etching fluid.

INDUSTRIAL APPLICABILITY

The luminescent device and the method for manufacturing a luminescent device and a semiconductor device in accordance with the present invention are applicable to LED optical devices and methods for manufacturing LED optical devices.

DESCRIPTION OF SYMBOLS

11: Semiconductor layer
11a: n-type GaN layer (n-type semiconductor layer: n-type layer)
11b: Luminescent layer
11c: p-type GaN layer (p-type semiconductor layer: p-type layer)
12: Supporting substrate
13: Concave portion
13a: Flat bottom face (flat portion)
13b: Tapered side face
14: Foundation layer
14a: Seed layer
14b: Reflection layer
20: Epitaxial substrate
21: Lift-off layer
22: Separation groove
23: p-side electrode
24: Covering layer
40: luminescent device
42: Sacrificing portion

What is claimed is:

1. A manufacturing method for a semiconductor device, comprising:
    a device region formation step of forming a device region constituted by a semiconductor layer on part of an epitaxial substrate through a lift-off layer;
    a sacrificing portion formation step of forming a sacrificing portion, being not removed in a later-mentioned chemical lift-off step, around the device region on the epitaxial substrate;
    a covering step of forming a covering layer that covers the epitaxial substrate while leaving exposed at least part of the semiconductor layer and at least part of the sacrificing portion;
    a foundation layer formation step of forming a foundation layer on a surface on the epitaxial substrate including part on the semiconductor layer and on the sacrificing portion and a covering layer surface;
    a plating step of forming a supporting substrate by providing plating on the foundation layer;
    a covering layer removing step of dissolution removing of the covering layer;
    a chemical lift-off step of separating between the semiconductor layer and the epitaxial substrate by dissolution removing of the lift-off layer; and
    a sacrificing portion removing step of separating between the epitaxial substrate and the foundation layer at the sacrificing portion after the chemical lift-off step.

2. A manufacturing method for a luminescent device including a semiconductor layer having a luminescent layer, comprising:
    a device region formation step of forming a device region constituted by the semiconductor layer on part of an epitaxial substrate through a lift-off layer;
    a sacrificing portion formation step of forming a sacrificing portion, being not removed in a later-mentioned chemical lift-off step, around the device region on the epitaxial substrate;
    a covering step of forming a covering layer that covers the epitaxial substrate while leaving exposed at least part of the semiconductor layer and at least part of the sacrificing portion;
    a foundation layer formation step of forming a foundation layer on a surface on the epitaxial substrate including part on the semiconductor layer and on the sacrificing portion and a covering layer surface;
a plating step of forming a supporting substrate by providing plating on the foundation layer;
a covering layer removing step of dissolution removing of the covering layer;
a chemical lift-off step of separating between the semiconductor layer and the epitaxial substrate by dissolution removing of the lift-off layer; and
a sacrificing portion removing step of separating between the epitaxial substrate and the foundation layer at the sacrificing portion after the chemical lift-off step.

3. The manufacturing method for a luminescent device of claim 2, wherein, in the device region formation step, the semiconductor layer includes an n-type layer, a luminescent layer, and a p-type layer, being constituted by a group III nitride semiconductor, in this order from a top surface of the epitaxial substrate side, on which the semiconductor layer is formed.

4. The manufacturing method of claim 2, wherein, in the covering step, a photoresist is coated for making a covering such that the level of the covering layer surface from the epitaxial substrate at least on the sacrificing portion is lower than the luminescent layer, and part of the covering layer on the semiconductor layer and the sacrificing portion is removed by photolithography.

5. The manufacturing method of claim 4, wherein, in the foundation layer formation step, the foundation layer includes a reflection layer on the semiconductor layer.

6. A luminescent device manufactured by the manufacturing method for a luminescent device of claim 2.

* * * * *